United States Patent [19]
Kim

[11] Patent Number: 5,889,418
[45] Date of Patent: Mar. 30, 1999

[54] FREQUENCY DETECTOR OF PHASE LOCKED LOOP

[75] Inventor: Je-kook Kim, Seoul, Rep. of Korea

[73] Assignee: Samsung Electronics, Co., Ltd., Suwon, Rep. of Korea

[21] Appl. No.: 962,520

[22] Filed: Oct. 31, 1997

[30]     Foreign Application Priority Data

Oct. 31, 1996 [KR] Rep. of Korea ................... 1996 51482

[51] Int. Cl.$^6$ ............................................................. H03K 9/06
[52] U.S. Cl. ............................................... 327/47; 327/49
[58] Field of Search .................................... 327/3, 12, 26, 327/38–41, 43, 44, 46, 47, 49, 147, 148, 150, 156, 157, 159; 331/17; 375/373, 375, 120

[56]              References Cited

U.S. PATENT DOCUMENTS

| | | | |
|---|---|---|---|
| 4,628,282 | 12/1986 | Hikawa et al. | 331/1 A |
| 5,012,492 | 4/1991 | Sexton et al. | 375/82 |
| 5,302,916 | 4/1994 | Pritchett | 331/1 A |
| 5,337,335 | 8/1994 | Cloetens et al. | 375/120 |
| 5,631,582 | 5/1997 | Fujikawa | 327/12 |

*Primary Examiner*—My-Trang Nu Ton
*Attorney, Agent, or Firm*—Marger Johnson & McCollom P.C.

[57]                ABSTRACT

A frequency detector in a phase locked loop which generates a clock signal for reproducing a signal from a optical disc. 3 T information corresponding to an upper limit of the frequency of the Eight-to-Fourteen Modulation signal is compared with the oscillation clock of the VCO divided by three to reduce the oscillation frequency of the VCO. Additionally, 11 T information corresponding to a lower limit of the frequency of the Eight-to-Fourteen Modulation signal is compared with the oscillation clock of the VCO divided by eleven to increase the oscillation frequency of the VCO thereby providing a VCO which oscillates at a frequency corresponding to the frequency of the Eight-to-Fourteen Modulation signal.

24 Claims, 9 Drawing Sheets

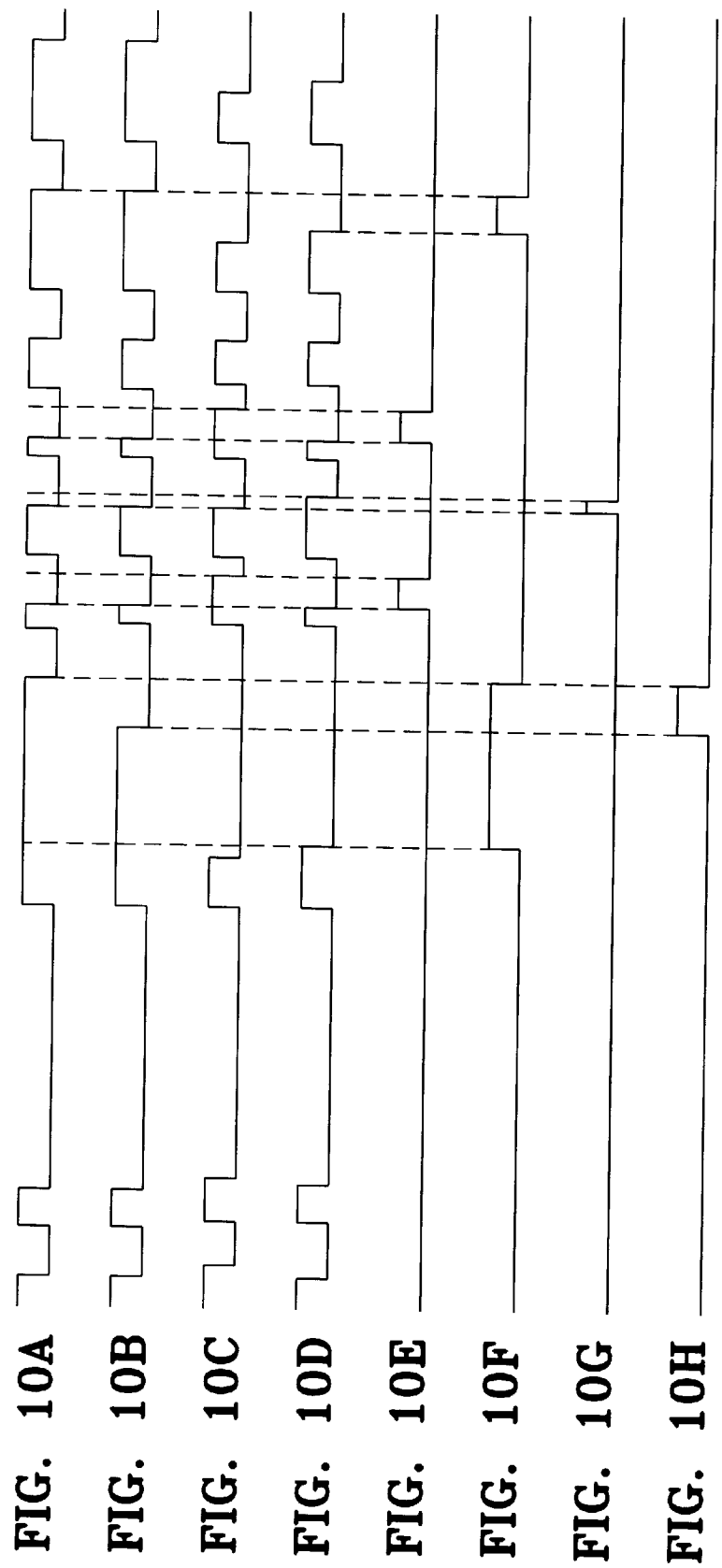

FREQUENCY DETECTOR OF PHASE LOCKED LOOP

BACKGROUND OF THE INVENTION

1. Field of the Invention

The present invention relates to a phase locked loop ("PLL"), and more particularly, to a frequency detector which generates a frequency error signal for controlling the oscillation frequency of a voltage-controlled oscillator ("VCO") in the PLL.

2. Description of the Related Arts

Typically, the reproduction of an Eight-to-Fourteen Modulation ("EFM") signal of a Compact Disc ("CD") player, for example, requires a bit clock synchronized to the EFM signal. This bit clock is generated in the PLL of the CD player. The EFM signal comprises various frequencies ranging from a minimum active duration Tmin of 3 T (where T denotes a system clock period) to a maximum active duration Tmax of 11 T.

The oscillation frequency of a VCO in a PLL circuit is typically controlled using a bit clock. To generate a bit clock in a conventional PLL, the number of clocks generated from the VCO in the PLL circuit are counted during the maximum duration Tmax of the EFM signal. That is, the oscillation frequency of the VCO is controlled according to the difference between the number of VCO clocks counted during the maximum active duration Tmax of the VCO and the number of VCO clocks during a normal operation.

The counting method described above requires a VCO which oscillates at a much greater frequency than the oscillation frequency of the EFM signal. Notably, it is difficult to implement a VCO which oscillates at a high frequency in an integrated circuit. Also, since the oscillation characteristics of the VCO are not linearly related to the control voltage, more accurate correction is required at higher frequencies.

Furthermore, as the frequency of the EFM signal is increased according to the reproduction speed of the CD, the higher speed CD player requires a VCO oscillating at an even higher frequency.

Also, counting the VCO clocks is carried out intermittently because VCO information is generated once per 588 T frame. Accordingly, where the frequency of the EFM signal changes rapidly, in a variable-speed reproduction operation, for example, the oscillation frequency of the VCO cannot rapidly follow the change of the EFM signal frequency.

SUMMARY OF THE INVENTION

It is an object of the present invention is to provide a frequency detector which is adapted to a VCO having an oscillation frequency corresponding to a frequency of an EFM signal.

In order to achieve the above object, there is provided a frequency detector for detecting an error between the frequency of an EFM signal and the frequency of a VCO oscillation clock in a phase locked loop (PLL) and generating a control signal for controlling an oscillation frequency of the VCO.

In the frequency detector there is provided first pulse generating means is responsive to the EFM signal and generates a first pulse signal having duration of 3 Tvco, where Tvco is a period of the VCO oscillation clock. Second pulse generating means is responsive to the EFM signal and generates a second pulse signal having duration of 11 Tvco maximum. Comparing means are also provided which receive the EFM signal, the first, and the second pulse signals, and generates a first control signal indicating an interval in which the EFM signal is at a high logic level and the first pulse signal is at a low logic level and a fourth control signal indicating an interval in which the EFM signal is at a low logic level and the second pulse signal is at a high logic level.

Additionally provided is first up signal generator for increasing the oscillation frequency of the VCO in the PLL which receives the EFM signal, the first pulse signal, and the first control signal, and generates a first up signal indicating an interval in which the EFM signal is at a high logic level and the first pulse signal is at a low logic level. Also provided is a down signal generator for decreasing the oscillation frequency of the VCO in the PLL which receives the EFM signal, the third pulse signal, and the fourth control signal, and generates a down signal indicating an interval in which the EFM signal is at a low logic level and the third pulse signal is at a high logic level.

BRIEF DESCRIPTION OF THE DRAWINGS

The above object and advantages of the present invention will become more apparent by describing in detail a preferred embodiment thereof with reference to the attached drawings in which:

FIGS. 6A–6D are a waveform diagram illustrating the operation of second pulse generator 12 shown in FIG. 5;

FIGS. 8A–8C are a waveform diagram illustrating the operation of third pulse generator 14 shown in FIG.7;

FIGS. 10A–10H are a waveform diagram illustrating the operation of comparator 16 shown in FIG. 9;

DESCRIPTION OF THE PREFERRED EMBODIMENTS

Figure 1:
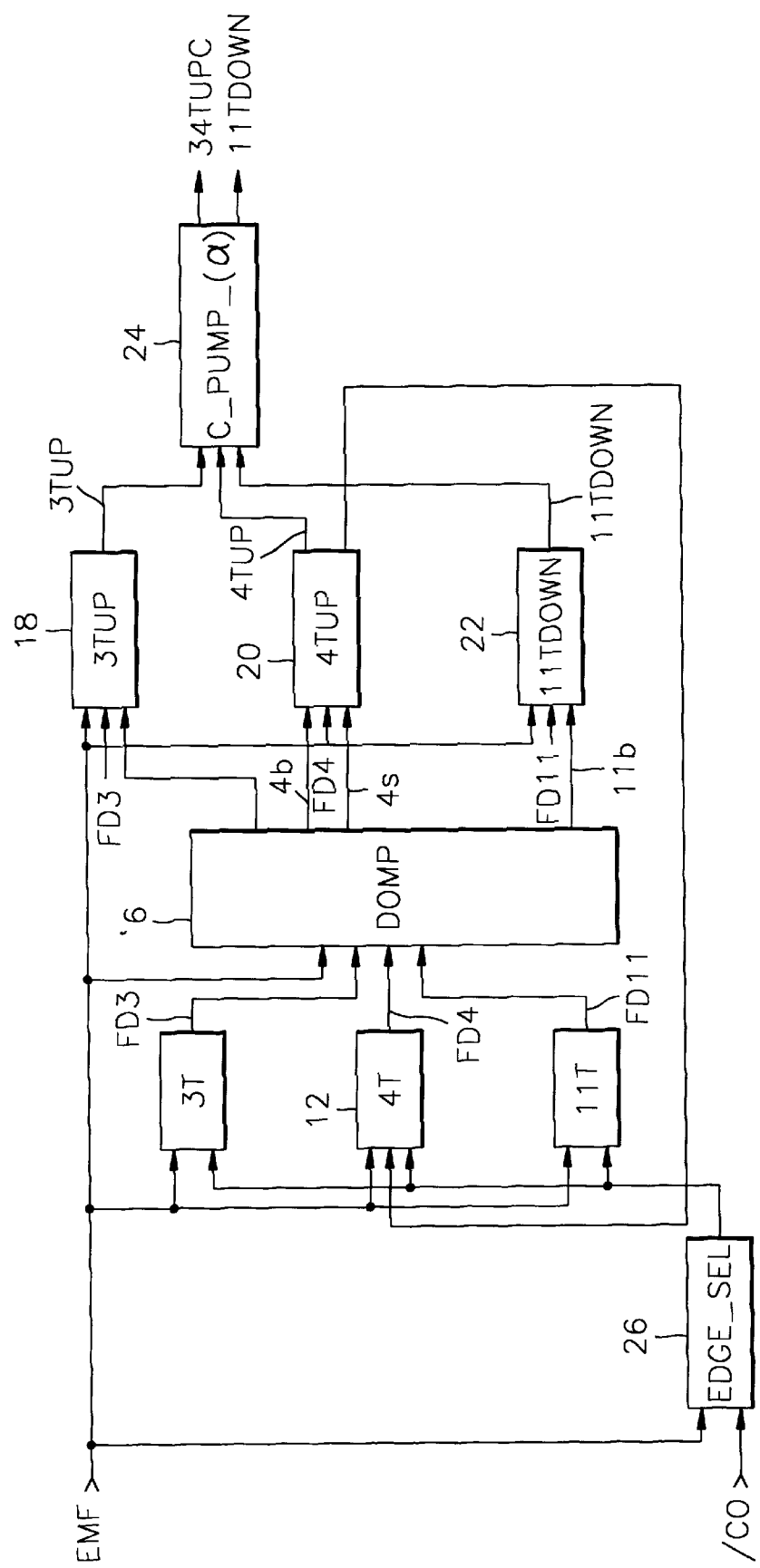
FIG. 1 is a block diagram of a frequency detector according to the present invention.

Referring to FIG. 1, the frequency detector includes first pulse generator 10, second pulse generator 12, third pulse generator 14, comparator 16, first up signal generator 18, second up signal generator 20, down signal generator 22, charge pump controller 24, and edge selector 26.

First pulse generator 10 generates first pulse signal FD3 triggered from a rising edge of the EFM signal. First pulse signal FD3 lasts for 3 Tvoc, where Tvco is the oscillation period of the VCO.

Second pulse generator 12 generates second pulse signal FD4 triggered from the leading edge of the EFM signal. Second pulse signal FD4 lasts for up to 4 Tvco and is reset when the level of the EFM signal changes during the period when second pulse signal FD4 is active or when a reset signal RESET is applied to a reset terminal of second pulse generator 12.

Third pulse generator 14 generates third pulse signal FD11 triggered from the rising edge of the EFM signal. Third pulse signal FD11 lasts for up to 11 Tvco and is reset when the level of the EFM signal changes during the period when third pulse signal FD11 is active.

The operation of each of pulse generators 10, 12, and 14 need not necessarily be triggered from the rising edge of the EFM signal. This is so because the information intervals of 3 T, 4 T, and 11 T may be generated while the EFM signal is at a low logic level of the EFM signal, as well, as at a high logic level.

Comparator 16 compares the EFM signal with the first through third pulse signals FD3, FD4, and FD11, respectively, and outputs the compared results as the first through fourth control signals 3s, 4b, 4s, and 11b, respectively. First control signal 3s is active when first pulse signal FD3 is at a low level and the EFM signal is at a high level. Second control signal 4b is active when second pulse signal FD4 is at a high level and the EFM signal is at a low level. Third control signal 4s is active when second pulse signal FD4 is at a low level and the EFM signal is at a high level. Fourth control signal 11s is active when third pulse signal FD11 is at a low level and the EFM signal is at a high level.

First up signal generator 18 receives the EFM signal, first control signal 3s, and first pulse signal FD3 and generates a first up signal 3TUP which increases the oscillation frequency of the VCO during an interval in which the EFM signal is at a low level and first pulse signal FD3 is at a high level, that is, where 3 Tvco is longer than 3 T.

Second up signal generator 20 generates second up signal 4TUP which increases the oscillation frequency of the VCO during an interval in which the EFM signal is at a low level and second pulse signal FD4 is at a high level, that is, where 4 Tvco is longer than 4 T.

Down signal generator 22 generates down signal 11TDOWN which reduces the oscillation frequency of the VCO during an interval in which the EFM signal is at a high level and third pulse signal FD11 is at a low level, that is, where 11 Tvco is shorter that 11 T.

Charge pump controller 24 generates signals 34TUPC and 11TDOWNC which are applied to a charge pump (not shown). Charge pump controller 24 controls the oscillation frequency of the VCO in response to first up signal 3TUP, second up signal 4TUP, and down signal 11TDOWN. Signal 34TUPC increases the oscillation frequency of the VCO while the signal 11DOWNC decreases the oscillation frequency of the VCO.

Figure 2:
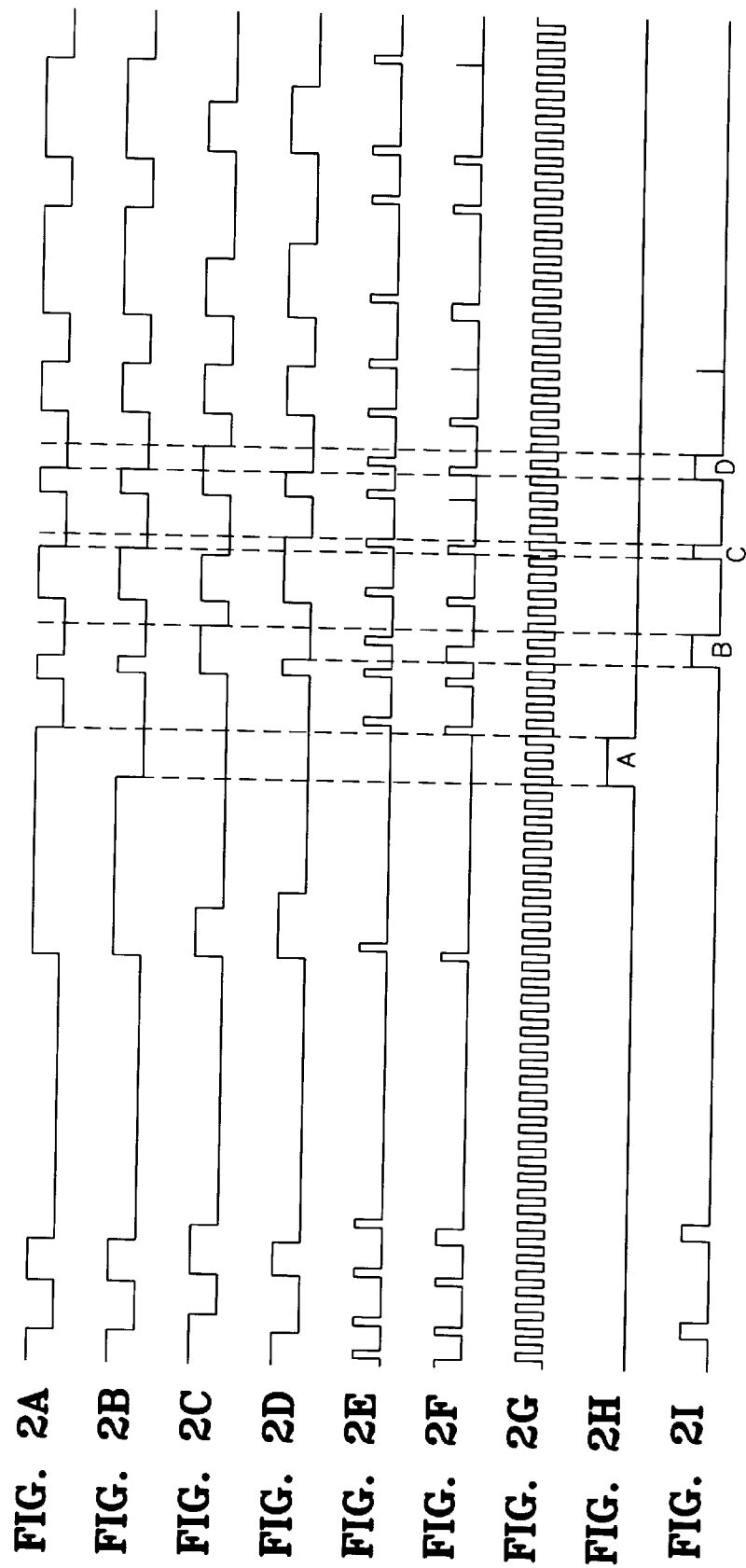
FIGS. 2A–2I are a waveform diagram illustrating the operation of the frequency detector shown in FIG. 1.

FIG. 2A is a waveform diagram of a typical EFM signal. FIGS. 2B through 2D illustrate resultant waveforms of third pulse signal FD11, first pulse signal FD3, and second pulse signal FD4, respectively. FIGS. 2E through 2G are waveform diagrams of VCO clock and charge pump control signals 11DOWNC and 34TUP, respectively.

Reference character A in FIG. 2H indicates the interval in which the EFM signal is longer than third pulse signal FD11. Reference character B and D in FIG. 2I indicate the interval in which the EFM signal is shorter than first pulse signal FD3. Reference character C in FIG. 2I indicates the interval in which the EFM signal is shorter than second pulse signal FD4.

During interval A, the oscillation frequency of the VCO is reduced since the 11 T information interval of the EFM signal is longer than the VCO oscillation frequency divided by eleven. Meanwhile, during intervals B and D, the oscillation frequency of the VCO is increased since the 3 T information interval of the EFM signal is shorter than the VCO frequency divided by three.

The frequency detector of FIG. 1 controls the frequency of the VCO only when the 11 T-information interval of the EFM signal is longer than an VCO frequency divided by eleven or the 3 T information interval of the EFM signal is shorter than an VCO frequency divided by three. At other times, charge pump controller 24 does not generate control signals 34TUPC and 11TDOWNC and the oscillation phase of the VCO is controlled within ±50% of T by a phase controller (not shown).

Figure 3:
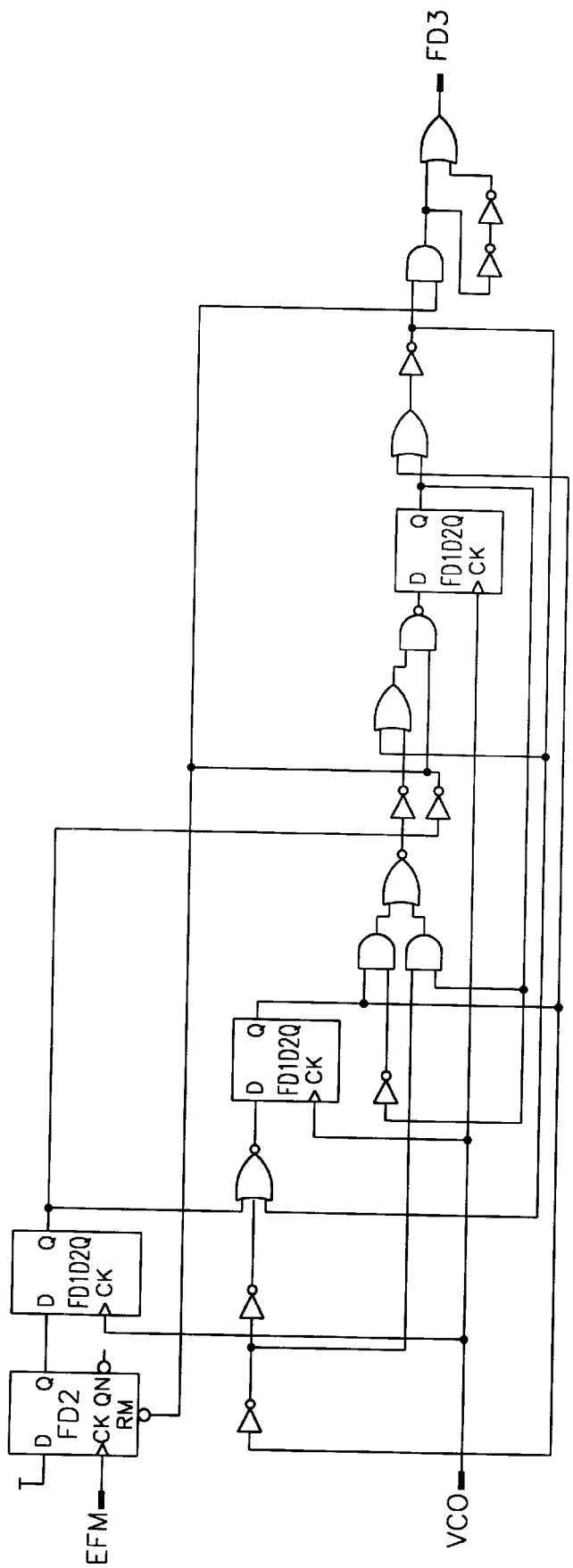
FIG. 3 is a detailed block diagram of the first pulse generator shown in FIG. 1.

FIG. 3 is a detailed block diagram of first pulse generator 10 which outputs first pulse signal FD3. The circuit shown in FIG. 3 is generated by a simulation program such as VERILOG SYNTHESIS™ by providing the program with input signals EFM and VCO and first pulse signal FD3. VERILOG SYNTHESIS™ is a product of Cadence Design Systems located in San Jose, California. First pulse signal FD3 is triggered by the rising edge of the EFM signal and lasts for three periods of the VCO clock.

Figure 4:
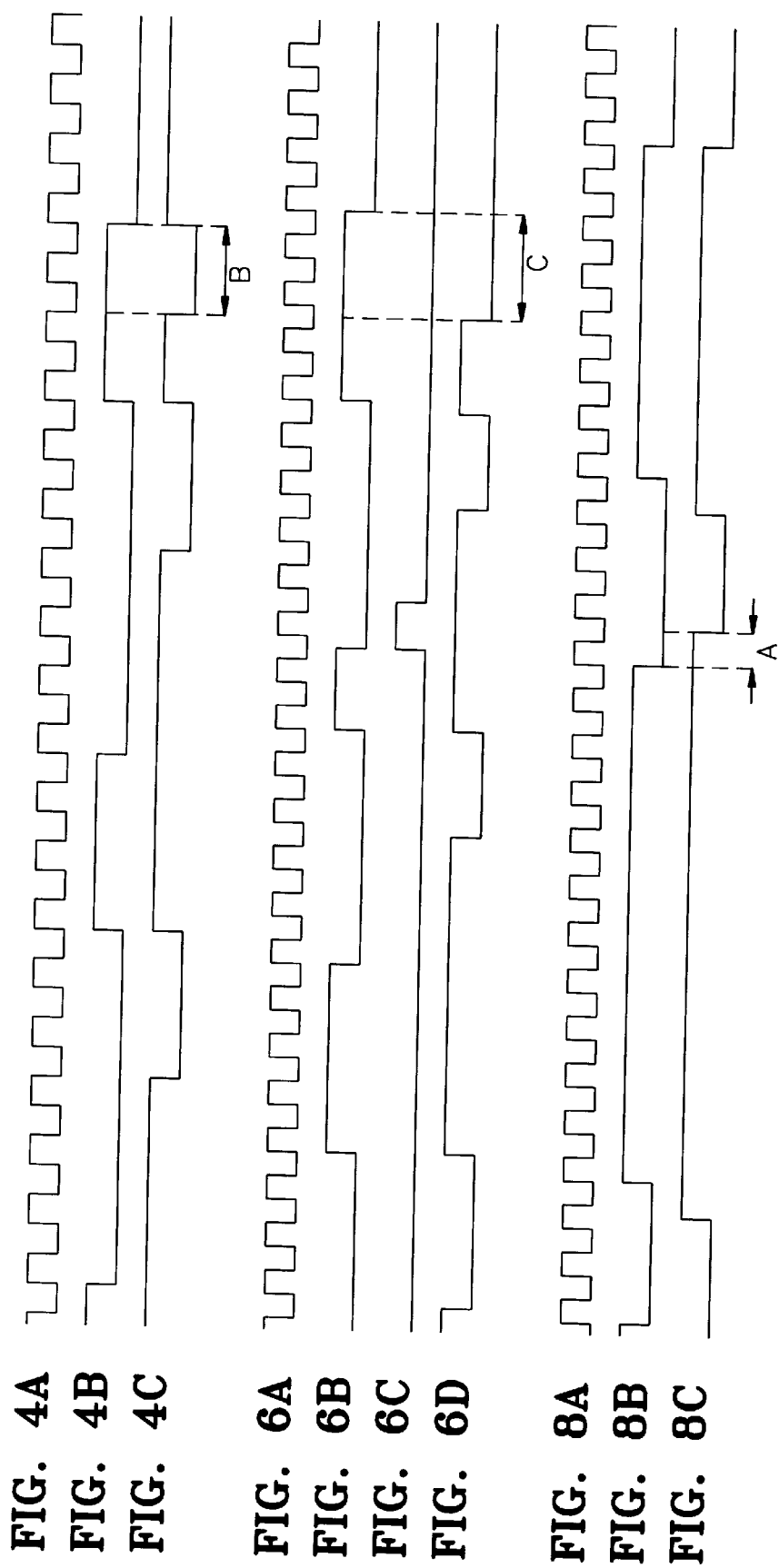
FIGS. 4A–4C are a waveform diagram illustrating the operation of the first pulse generator shown in FIG. 3.

FIG. 4A is a waveform diagram of the oscillation signal from the VCO. FIGS. 4B and 4C are waveform diagrams of first pulse signal FD3 and the EFM signal, respectively. During interval B of FIG. 4C in which first control signal 3s is at a high level and the EFM signal is at a low level, the frequency of the VCO is controlled by the frequency detector shown in FIG. 1.

Figure 5:
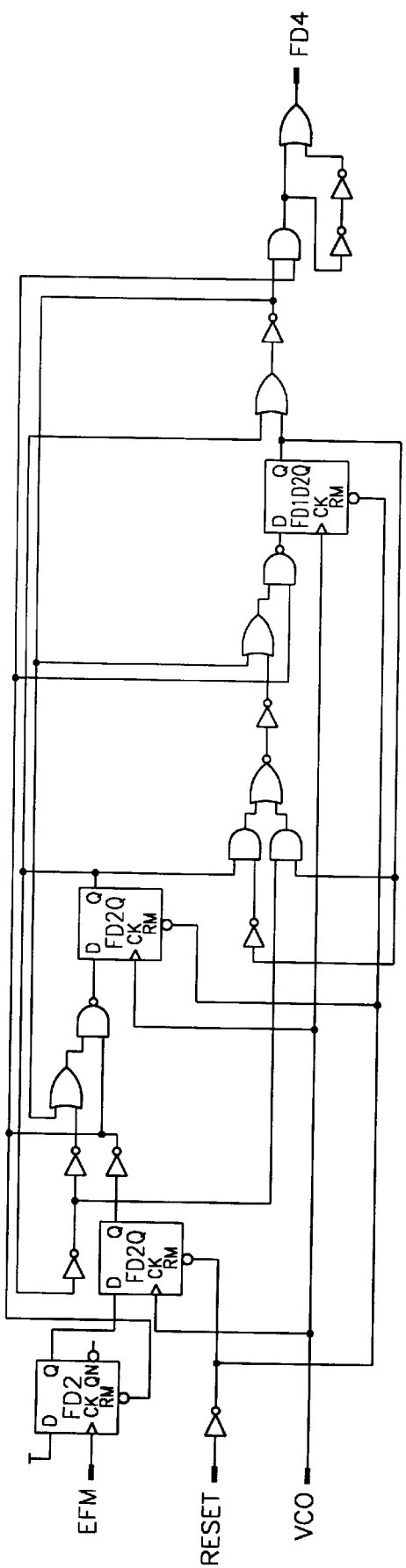
FIG. 5 is a detailed block diagram of second pulse generator 12 shown in FIG. 1.

FIG. 5 is a detailed block diagram of second pulse generator 12 which outputs second pulse signal FD4. The circuit shown in FIG. 5 is generated by a simulation program such as VERILOG SYNTHESIS™ by providing the program with input signals EFM and VCO and second pulse signal FD4. Second pulse signal FD4 is triggered from a rising edge of the EFM signal and lasts for up to four periods of the VCO clock.

Second pulse signal FD4 is deactivated when the EFM signal makes a transition from a high level to a low level or a reset signal RESET is applied within the four periods of VCO clock.

FIG. 6A is a waveform diagram of the oscillation signal from the VCO. FIGS. 6B through 6D illustrate timing waveforms of second pulse signal FD4, reset signal RESET, and the EFM signal, respectively.

During interval C shown in FIG. 6D, the frequency of the VCO is controlled by the frequency detector of FIG.1. As shown in FIG. 6B, second pulse signal FD4 is deactivated when the EFM signal makes a transition from a high level to a low level or when reset signal RESET is applied.

Figure 7:
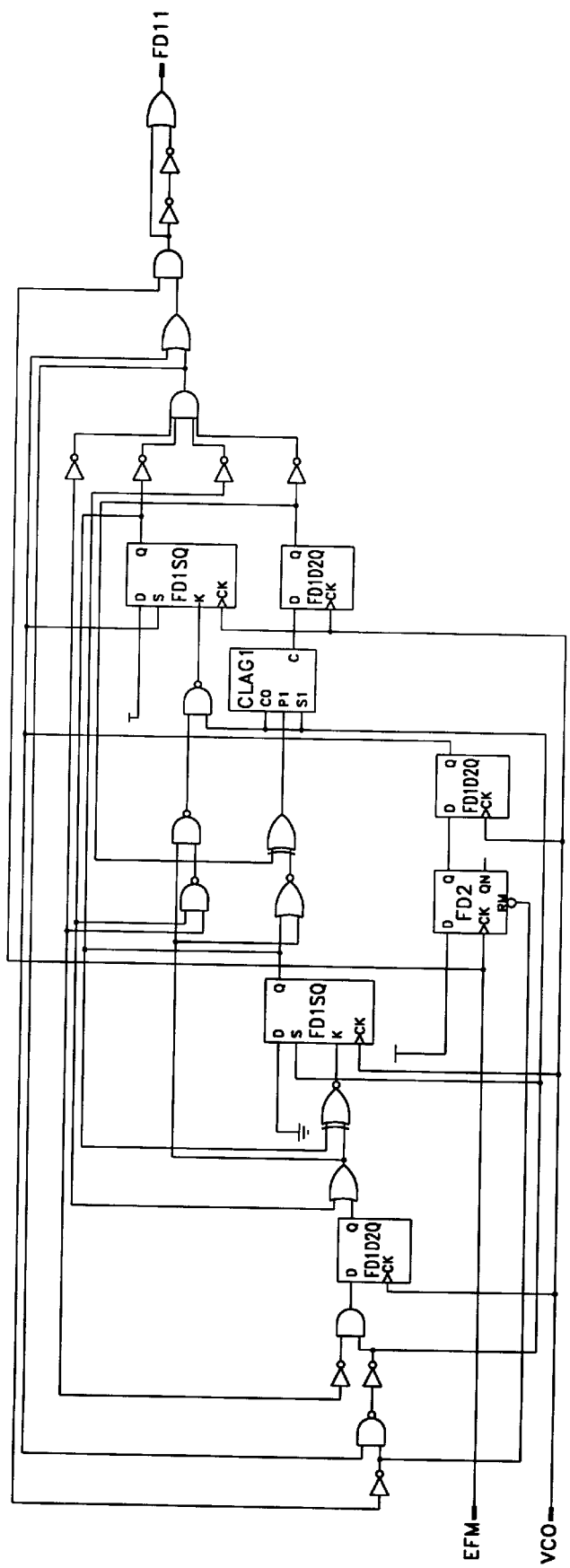
FIG. 7 is a detailed block diagram of third pulse generator 14 shown in FIG. 1.

FIG. 7 is a detailed block diagram of third pulse generator 14 which outputs third pulse signal FD11 triggered from a rising edge of the EFM signal. The circuit shown in FIG. 7 is generated by a simulation program such as VERILOG SYNTHESIS™ by providing the program with input signals EFM and VCO and third pulse signal FD11. Third pulse signal FD11 lasts for up to eleven periods of the VCO clock. Third pulse signal FD11 is deactivated when the EFM signal makes a transition from a high level to a low level within the eleven periods of the VCO clock.

FIG. 8A is a waveform diagram of the oscillation signal from the VCO. FIGS. 8B through 8D illustrate the waveforms of third pulse signal FD11 and the EFM signal, respectively. During interval A shown in FIG. 8C, the frequency of the VCO is controlled by the frequency detector of FIG. 1. As shown in FIG. 8C, third pulse signal FD11 is deactivated when the EFM signal makes a transition from a high level to a low level.

Figure 9:
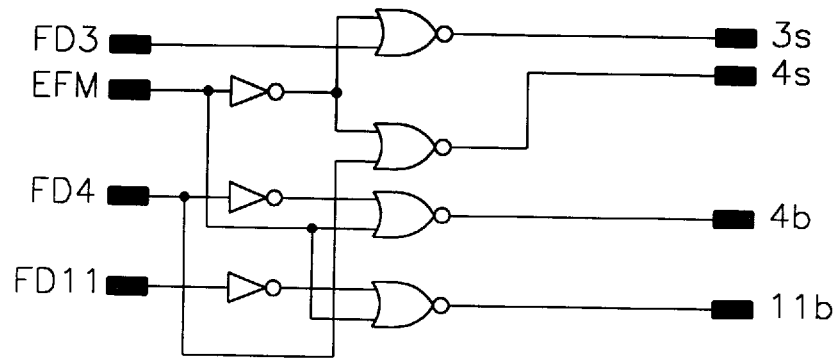
FIG. 9 is a detailed block diagram of comparator 16 shown in FIG. 1.

Referring to FIG. 9, comparator 16 receives and compares the EFM signal and the first through the third pulse signals FD3, FD4, and FD11, respectively. Comparator 16 outputs the compared results as first through fourth control signals 3s, 4b, 4s, and 11b, respectively. First control signal 3s is generated when the EFM signal is at a low level and first pulse signal FD3 is at a high level. Second control signal 4b is generated when the EFM signal is at a high level and second pulse signal FD4 is at a low level. Third control signal 4s is generated when the EFM signal is at a low level and second pulse signal FD4 is at a high level. Fourth control signal 11b is generated when the EFM signal is at a high level and third pulse signal FD11 is at a low level.

FIG. 10A is a waveform diagram of input signal EFM. FIGS. 10B through 10H illustrate timing waveforms of third pulse signal FD11, first pulse signal FD3, second pulse signal FD4, first control signal 3s, second control signal 4b, third control signal 4s, and fourth control signal 11b.

Figure 11:
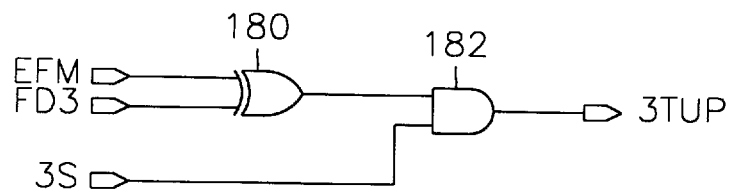
FIG. 11 is a detailed block diagram of first up signal generator 18 shown in FIG. 1.

FIG. 11 is a detailed block diagram of first up signal generator 18 of FIG. 1. Referring to FIG. 11, first up signal generator 18 receives the EFM signal, first pulse signal FD3, and first control signal 3s and generates first up signal 3TUP when the EFM signal is at a low level and first pulse signal is at a high level.

Exclusive-OR gate 180 detects the interval (a first difference signal) in which the logic level of the EFM signal is not the same as that of first pulse signal FD3. AND gate 182 carries out a logical AND operation of the first difference signal output from exclusive-OR gate 180 and first control signal 3s such that the first difference signal is provided to its output terminal when the EFM signal is at a low level and first pulse signal FD3 is at a high level.

Figure 12:
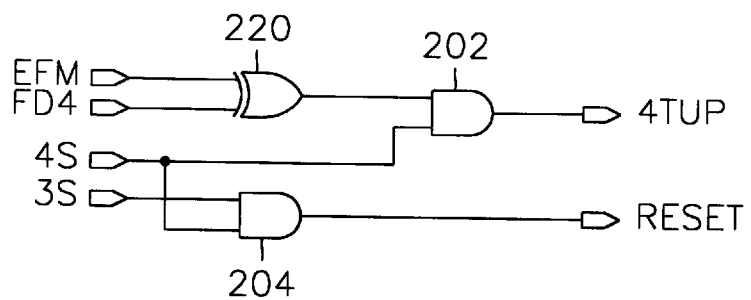
FIG. 12 is a detailed block diagram of second up signal generator 20 shown in FIG. 1.

FIG. 12 is a detailed block diagram of second up signal generator 20 of FIG. 1. Referring to FIG. 12, second up signal generator 20 receives the EFM signal, second pulse signal FD4, first control signal 3s, and third control signal 4s and generates second up signal 4TUP when the EFM signal is at a low level and second pulse signal FD4 is at a high level. Also, second up signal generator 20 generates a RESET signal when both first control signal 3s and third control signal 4s are a high level.

Exclusive-OR gate 200 detects the interval (a second difference signal) in which the logic level of the EFM signal is not the same as that of second pulse signal FD4. AND gate 202 carries out a logical AND operation of the second difference signal from exclusive-OR gate 200 and third control signal 4s such that the second difference signal is provided to its output terminal when the EFM signal is at a low level and first pulse signal FD3 is a high level. The other AND gate 204 generates a reset signal RESET when first control signal 3s is at a high level and third control signal 4s is at a high level.

Reset signal RESET is applied to second pulse generator 12 of FIG. 1 to reset second pulse signal FD4. Second pulse generator 12 is included to compensate for first control signal generator 10 when the information obtained during a 3 T period of the EFM signal does not exist in the EFM signal. Even though the 11 T information of the EFM signal typically exists for every frame, the 3 T information may or may not exist in the EFM signal. Accordingly, where the 3 T information does not exist, the oscillation frequency of the VCO is controlled by other information.

In the present embodiment of the invention, the oscillation frequency of the VCO is controlled by 4 T information when the 3 T information does not exist in the EFM signal. However, 5 T or 6 T information may be used in alternative embodiments.

Meanwhile, where both the 3 T and 4 T information exist, it is preferable that the control operation is performed only by the 3 T information. Thus, when both the 3 T and 4 T information exist, that is, when first control signal 3s and third control signal 4s are at high levels, second pulse signal FD4 is reset.

Figure 13:
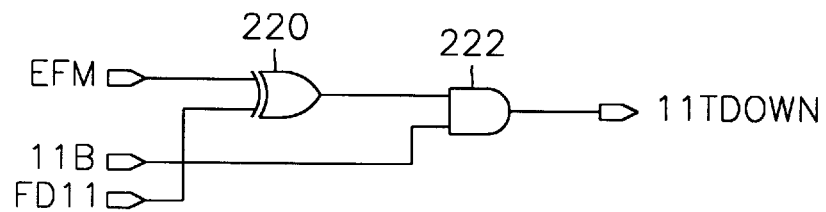
FIG. 13 is a detailed block diagram of down signal generator 22 shown in FIG. 1.

FIG. 13 is a detailed block diagram of down signal generator 22 of FIG. 1 which receives the EFM signal, third pulse signal FD11, and a fourth control signal 11b. Down signal generator 22 generates signal 11TDOWN when the EFM signal is at a high level and third pulse signal FD11 is a low level.

Exclusive-OR gate 220 detects the interval (a third difference signal) in which the logic level of the EFM signal is not the same as that of third pulse signal FD11. AND gate 222 carries out a logical AND operation of the third difference signal output from exclusive-OR gate 220 and fourth control signal 11b such that third difference signal is provided to its output terminal when the EFM signal is at a high level and third pulse signal FD11 is at a low level.

Figure 14:
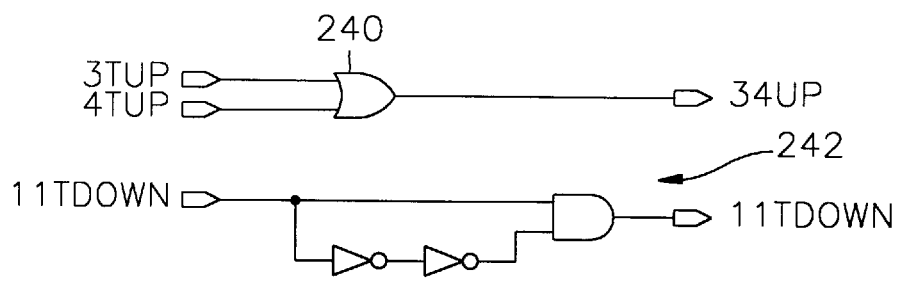
FIG. 14 is a detailed block diagram of charge pump controller 24 shown in FIG. 1.

FIG. 14 is a detailed block diagram of charge pump controller 24 of FIG. 1. Charge pump controller receives first up signal 3TUP, second up signal 4TUP, and down signal 11TDOWN and generates charge pump control signal 34UP. Charge pump controller 24 controls glitch components of down signal 11TDOWN and outputs the glitch-controlled down signal.

OR gate 240 performs a logical OR operation of first up signal 3TUP and second up signal 4TUP. OR gate 240 outputs the result as charge pump control signal 34UP to the charge pump which increases the oscillation frequency of the VCO. Thus, the lower limit of the oscillation frequency of the VCO is controlled by first up signal 3TUP and second up signal 4TUP.

A glitch controller 242 removes glitch components included in down signal 11TDOWN to stabilize the operation of the charge pump. Because the resolution of first up signal 3TUP, second up signal 4TUP, and down signal 11TDOWN is different from each other, it is preferable to make the sensitivity of first signal 3TUP and second up signal 4TUP higher by $1\frac{1}{3}$ and $1\frac{1}{4}$, respectively, than that of down signal 11TDOWN.

Figure 15:
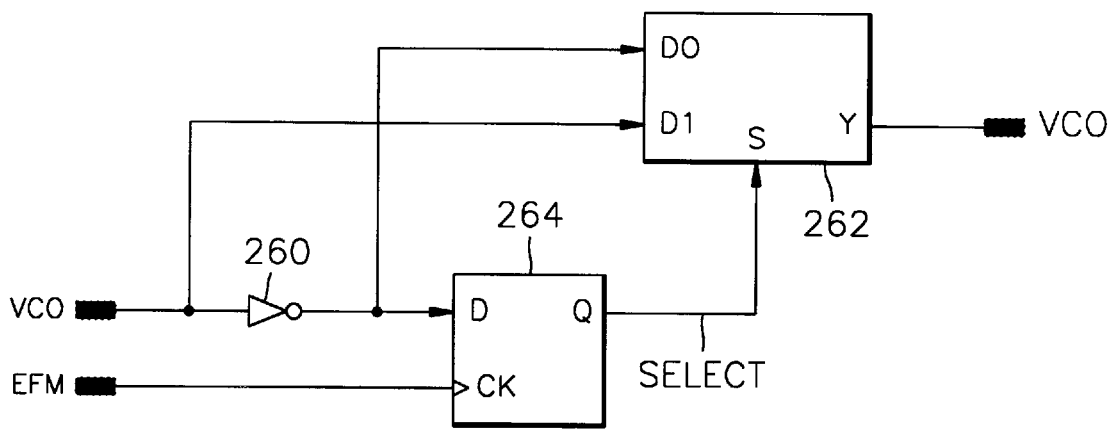
FIG. 15 is a detailed block diagram of edge selector 26 shown in FIG. 1.

FIG. 15 is a detailed block diagram of edge selector 26 of FIG. 1. Edge selector 26 makes first, second, and third pulse generators 10, 12, and 14, respectively, rapidly follow the rising edge of the EFM signal. Where first, second, and third pulse generators 10, 12, and 14, respectively, are triggered at the rising edge of the EFM signal and count the rising edge of the VCO clock to perform a division operation, the division operations of first, second, and third pulse generators 10, 12, and 14 may be delayed by a half of the period of the VCO clock when the VCO clock falls at the rising edge of the EFM signal. To prevent such a phenomenon, it is preferable that first, second, and third pulse generators 10, 12, and 14, respectively, rapidly respond when the VCO clock falls at the rising edge of the EFM signal.

Inverter 260 inverts the VCO clock. The VCO clock is applied to an input terminal of inverter 260 and the inverted VCO clock output from inverter 260 is applied to selector 262. Selector 262 selects one of either the VCO clock or the inverted VCO clock and outputs the selected signal according to selection signal SELECT.

The inverted VCO clock output by inverter 260 is provided to a D-input terminal of D flip-flop ("D-FF") 264. D-FF 264 latches an input provided to the D-input terminal at the rising edge of the EFM signal, provided to the clock input terminal, and outputs the latched state as selection signal SELECT through a Q-output terminal.

Accordingly, where the VCO clock is at a high level at the rising edge of the EFM, the selection signal SELECT is at a high level and the selector selects and outputs the inverted VCO clock. As a result, the operation of first, second, and third pulse generators 10, 12, and 14, respectively, are synchronized with a falling edge of the VCO clock.

On the other hand, where the VCO clock is in a low level at the rising edge of the EFM, the selection signal SELECT is at a low level and the selector selects and outputs the non-inverted VCO clock. As a result, the operation of first, second, and third pulse generators 10, 12, and 14, respectively, are synchronized with the rising edge of the VCO.

The frequency detector of the present invention compares the 3 T information of the EFM signal with the oscillation frequency of the VCO divided by three, controlling the oscillation frequency of the VCO such that the frequency is decreased accordingly. Also, the frequency detector compares the 11 T information of the EFM signal with the oscillation frequency of the VCO divided by eleven, controlling the oscillation frequency of the VCO such that the frequency is increased accordingly. Therefore, the frequency detector of the present invention makes it possible to use a VCO with an oscillation frequency corresponding to the frequency of the EFM signal.

Additionally, since the detector uses the 11 T information generated once each frame and the 3 T information generated often, the oscillation frequency of the VCO can rapidly follow a change of the EFM signal frequency. Furthermore, the control operation is stabilized by using 4 T information when 3 T information is not available.

In another embodiment of the present invention, it is possible to use 3 T information and the VCO clock divided by three to increase the oscillation frequency of the VCO while using the 11 T information and VCO clock divided by eleven to decrease the oscillation frequency of the VOC.

The frequency detector may be adapted to a PLL for a digital video disc (DVD) player without departing from the scope of the present invention. The EFM signal of the DVD includes 3 T, 11 T, and 14 T information included in a frame synchronization signal. Accordingly, the oscillation frequency of the VCO may be controlled using the 14 T information instead of the 11 T information in a DVD player.

I claim:

1. A frequency detector for detecting an error between a frequency of an EFM signal and a frequency of an oscillation clock from a VCO in a PLL, the frequency detector comprising:

first pulse generating means for generating a first pulse signal responsive to the EFM signal, the first pulse signal being in a first logic state for a first preselected number of VCO oscillation clock periods;

second pulse generating means for generating a second pulse signal responsive to the EFM signal, the second pulse signal being in the first logic state for a second preselected number of VCO oscillation clock periods;

comparing means for comparing the EFM signal, the first pulse signal, and the second pulse signal and generating a first and a second control signals responsive to the comparison;

a first up signal generator for generating a first up signal for increasing an oscillation frequency of the VCO responsive to the EFM signal, the first pulse signal, and the first control signal; and a down signal generator for generating a down signal for decreasing the oscillation frequency of the VCO responsive to the EFM signal, a third pulse signal, and the second control signal.

2. The frequency detector of claim 1 wherein the first preselected number of oscillation clocks is three VCO oscillation clock periods and wherein the second preselected number of VCO oscillation clock periods is less than or equal to eleven VCO oscillation clock periods.

3. The frequency detector of claim 2 wherein the first control signal indicates an interval when the EFM signal is in the first logic state and the first pulse signal is in a second logic state and the second control signal indicates an interval when the EFM signal is in the second logic state and the second pulse signal is in the first logic state.

4. The frequency detector of claim 2 wherein the first up signal indicates an interval when the EFM signal is in a first logic state and the first pulse signal is in a second logic state.

5. The frequency detector of claim 2 further comprising third pulse generating means for generating the third pulse signal responsive to the EFM signal, the third pulse signal being in the first logic state for a third preselected number of VCO oscillation clock periods.

6. The frequency detector of claim 5 wherein the third preselected number of VCO oscillation clock periods is less than or equal to four VCO oscillation clock periods.

7. The frequency detector of claim 6 wherein said comparing means includes comparing the EFM signal, the first pulse signal, the second pulse signal, and the third pulse signal and generating a third and a fourth control signals responsive to the comparison.

8. The frequency detector of claim 7 wherein the third control signal is in the first logic state when the EFM signal is in the first logic state and the second pulse signal is in a second logic state.

9. The frequency detector of claim 7 wherein the fourth control signal is in the first logic state when the EFM signal is in a second logic state and the third pulse signal is in the first logic state.

10. The frequency detector of claim 6 further including a second up signal generator for generating a second up signal for increasing the oscillation frequency of the VCO responsive to the third pulse signal and the third and fourth control signals, the second up signal for increasing the oscillation frequency of the VCO.

11. The frequency detector of claim 6 further comprising edge selection means for providing an inverted VCO oscillation clock to said first, second, and third pulse generating means responsive to the EFM signal.

12. The frequency detector of claim 11 wherein said edge selection means provides a VCO oscillation clock to said first, second, and third pulse generating means responsive to the EFM signal.

13. The frequency detector of claim 2 further comprising a glitch controller for removing glitch components included in the down signal.

14. A method for generating a frequency error signal for controlling an oscillation frequency of a VCO in a PLL, the method comprising:

generating a first pulse signal responsive to an EFM signal, the first pulse signal being in a first logic state for a first preselected number of VCO clock periods;

generating a second pulse signal responsive to the EFM signal, the second pulse signal being in the first logic state for a second preselected number of VCO clock periods;

comparing the EFM signal, the first pulse signal, and the second pulse signal and generating a first and second control signals responsive to the comparison; and generating a first up signal for controlling the oscillation frequency of the VCO clock responsive to the EFM signal, the first pulse signal, and the first control signal.

15. The method of claim 14 wherein the first preselected number of VCO clock periods is three and the second preselected number of VCO clock periods is less than or equal to eleven.

16. The method of claim 15 wherein the first control signal is in the first logic state when the EFM signal is in the first logic state and the first pulse signal is in a second logic state and wherein the second control signal is in the first logic state when the EFM signal is in the second logic state and the second pulse signal is in the first logic state.

17. The method of claim 15 wherein the first up signal is in the first logic state when the EFM signal is in the first logic state and the first pulse signal is in a second logic state.

18. The method of claim 15 further comprising the step of generating a third pulse signal responsive to the EFM signal, the third pulse signal being in the first logic state for a third preselected number of VCO clock periods.

19. The method of claim 18 wherein the third preselected number of VCO oscillation clock periods is less than or equal to four.

20. The method of claim 19 further comprising the step of generating a down signal for controlling the oscillation frequency of the VCO clock responsive to the EFM signal, the third pulse signal, and the second control signal.

21. The method of claim 19 further comprising the step of comparing the EFM signal, the first pulse signal, the second pulse signal, and the third pulse signal and generating a third and fourth control signals responsive to the comparison.

22. The method of claim 21 wherein the third control signal is in the first logic state when the EFM signal is in the first logic state and the second pulse signal is in a second logic state and wherein the fourth control signal is in the first logic state when the EFM signal is in the second logic state and the third pulse signal is in the first logic state.

23. The method of claim 21 further comprising the step of generating a second up signal for controlling the oscillation frequency of the VCO clock responsive to the third pulse signal, the third control signal, and the fourth control signal, the second up signal being in the first logic state when the EFM signal is in the first logic state and the third pulse signal is in the second logic state.

24. A frequency detector for controlling an oscillation frequency of an oscillation clock from a VCO in a PLL, the frequency detector comprising:

first pulse generating means for generating a first pulse signal responsive to an EFM signal, the first pulse signal being active for a first preselected number of VCO oscillation clock periods;

second pulse generating means for generating a second pulse signal responsive to the EFM signal, the second pulse signal being active for a second preselected number of VCO oscillation clock periods;

third pulse generating means for generating a third pulse signal responsive to the EFM signal, the third pulse signal being active for a third preselected number of VCO oscillation clock periods;

comparing means for comparing the EFM signal, the first pulse signal, the second pulse signal, and the third pulse signal and generating a first, a second, a third, and a fourth control signals responsive to the comparison;

a first up signal generator for generating a first up signal for increasing an oscillation frequency of the VCO clock responsive to the EFM signal, the first pulse signal, and the first control signal;

a down signal generator for generating a down signal for decreasing the oscillation frequency of the VCO responsive to the EFM signal, a third pulse signal, and the second control signal;

a second up signal generator for generating a second up signal for increasing the oscillation frequency of the VCO responsive to the third pulse signal, the third control signal, and the fourth control signal;

a glitch controller for removing glitch components included in the down signal; and edge selection means for providing the an inverted VCO oscillation clock to said first, second, and third pulse generating means responsive to the EFM signal.

* * * * *

UNITED STATES PATENT AND TRADEMARK OFFICE
CERTIFICATE OF CORRECTION

PATENT NO.  : 5,889,418
DATED       : March 30, 1999
INVENTOR(S) : Kim

Page 1 of 1

It is certified that error appears in the above-identified patent and that said Letters Patent is hereby corrected as shown below:

<u>Column 7,</u>
Line 49, "VOC" should read -- VCO --.

Signed and Sealed this

Twelfth Day of March, 2002

*Attest:*

*Attesting Officer*

JAMES E. ROGAN
*Director of the United States Patent and Trademark Office*